(12) United States Patent
Wang et al.

(10) Patent No.: US 12,074,126 B2
(45) Date of Patent: Aug. 27, 2024

(54) SEMICONDUCTOR STRUCTURE AND METHOD OF MANUFACTURING SAME

(71) Applicant: Changxin Memory Technologies, Inc., Anhui (CN)

(72) Inventors: Liang Wang, Hefei (CN); Qian Xu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 94 days.

(21) Appl. No.: 17/725,413

(22) Filed: Apr. 20, 2022

(65) Prior Publication Data
US 2023/0207501 A1 Jun. 29, 2023

(30) Foreign Application Priority Data
Dec. 24, 2021 (CN) .......................... 202111602336.1

(51) Int. Cl.
*H01L 23/00* (2006.01)

(52) U.S. Cl.
CPC .............. *H01L 24/02* (2013.01); *H01L 24/03* (2013.01); *H01L 24/05* (2013.01);
(Continued)

(58) Field of Classification Search
CPC ......... H01L 24/02; H01L 24/03; H01L 24/05; H01L 2224/0235; H01L 2224/0239; H01L 2224/03614; H01L 2224/03622; H01L 2224/0391; H01L 2224/05008; H01L 2224/0231; H01L 2224/02331; H01L 2224/02351; H01L 2224/02333; H01L 2224/02381; H01L 2924/01013; H01L 2924/01022; H01L 2924/04941; H01L 23/4824; H01L 23/4827; H01L 23/485
See application file for complete search history.

(56) References Cited

U.S. PATENT DOCUMENTS

2017/0256496 A1* 9/2017 Lin .................... H01L 24/02
2019/0355682 A1* 11/2019 Sugioka ................ G03F 1/54
(Continued)

FOREIGN PATENT DOCUMENTS

CN 102054809 B 12/2012
WO 2015/129279 A1 9/2015

*Primary Examiner* — Marcos D. Pizarro
*Assistant Examiner* — Tiberiu Dan Onuta
(74) *Attorney, Agent, or Firm* — Sheppard Mullin Richter & Hampton LLP

(57) ABSTRACT

A semiconductor structure and a method of manufacturing the semiconductor structure are provided. The semiconductor structure includes a substrate including a plurality of pads spaced apart from each other, a first groove, and a second groove connected with the first groove, the first and the second grooves located in the substrate. The first groove is located on the side of the second groove away from the plurality of pads, and the bottom of the second groove exposes a corresponding pad of the plurality of pads. The orthographic projection of the second groove on the substrate is located within the orthographic projection of the first groove on the substrate. A redistribution layer is disposed on a surface of the corresponding pad, the inner wall of the first groove, and the inner wall and the bottom of the second groove. The semiconductor structure prevents contamination or damage of test probes.

16 Claims, 8 Drawing Sheets

(52) U.S. Cl.
CPC ................ *H01L 2224/0235* (2013.01); *H01L 2224/0239* (2013.01); *H01L 2224/03614* (2013.01); *H01L 2224/03622* (2013.01); *H01L 2224/0391* (2013.01); *H01L 2224/05008* (2013.01); *H01L 2924/01013* (2013.01); *H01L 2924/01022* (2013.01); *H01L 2924/04941* (2013.01)

(56) References Cited

U.S. PATENT DOCUMENTS

2021/0305188 A1\* 9/2021 Shin .................... H01L 25/0652
2022/0415798 A1\* 12/2022 Li ...................... H01L 21/76826
2023/0016186 A1\* 1/2023 Kang ..................... H01L 24/02

\* cited by examiner

SEMICONDUCTOR STRUCTURE AND METHOD OF MANUFACTURING SAME

CROSS REFERENCE TO RELATED APPLICATION

This application claims priority to Chinese Patent Application No. 202111602336.1, filed Dec. 24, 2021, entitled "SEMICONDUCTOR STRUCTURE AND METHOD OF MANUFACTURING SAME", which is incorporated herein by reference in its entirety.

TECHNICAL FIELD

The present invention relates to the field of semiconductors, and more particularly, to a semiconductor structure and a method of manufacturing the semiconductor structure.

BACKGROUND

With the ever-changing development of electronic devices (e.g., transistors, diodes, resistors, capacitors, etc.), semiconductor manufacturing industries are growing rapidly. The production flow for semiconductors generally includes processes such as wafer fabrication, wafer acceptance test (WAT), chip package, and post-package test.

In chip package processes, Input/Output (I/O) pad positions may be changed through metal wiring or bumping processes. Generally, I/O pad positions of chips can be changed through redistribution layers (RDLs), so that the chips can be electrically connected to different packaging substrates or chips.

In the WAT, test probes of testing equipment need to pierce I/O pads to collect data for the WAT. However, due to the specific characteristics of the RDLs, it is difficult for the test probes to pierce these I/O pads, which adversarial affects the WAT. Additionally, the test probes and the chips are susceptible to contamination or damage during the WAT. Hence, a semiconductor structure that facilitates the WAT and thus reduces, if not eliminates, the contamination or damage during the WAT is urgently needed.

SUMMARY OF INVENTION

Embodiments of the present invention provide a semiconductor structure and a method of manufacturing the semiconductor structure.

According to some embodiments of the present invention, in one aspect, the embodiments of the present invention provide a semiconductor structure. The semiconductor structure may include a substrate including a plurality of pads spaced apart from each other in the substrate, and a first groove and a second groove connected with each other and located in the substrate.

The first groove may be located on the side of the second groove away from the plurality of pads. The bottom of the second groove may expose a corresponding pad of the plurality of pads. The orthographic projection of the second groove on the substrate may be located within the orthographic projection of the first groove on the substrate. A redistribution layer may be disposed on the surface of the corresponding pad, the inner wall of the first groove, and the inner wall and the bottom of the second groove.

According to some embodiments of the present invention, in another aspect, the embodiments of the present invention further provide a method of manufacturing a semiconductor structure. The method may include: providing a substrate including a plurality of pads spaced apart from each other; and patterning the substrate to form a first groove and a second groove connected with the first groove, the first and the second grooves located in the substrate, wherein the first groove is formed on the side of the second groove away from the plurality of pads, the bottom of the second groove exposes a corresponding pad of the plurality of pads, and the orthographic projection of the second groove on the substrate is located within the orthographic projection of the first groove on the substrate. The method may further include: forming a redistribution layer on the surface of the corresponding pad, the inner wall of the first groove, and the inner wall and the bottom of the second groove.

The technical solutions in accordance with the embodiments of the present invention have at least the following advantages.

The first groove and the second groove are connected with each other, and the width of the first groove is greater than the width of the second groove. A stair step is formed between the first groove and the second groove, which facilitates the disposition of relatively large size of the redistribution layer in the first groove, and reduces the height difference between the top surface of the redistribution layer and the top surface of the corresponding pad. This prevents contamination or even damage to the test probe, improves the reliability of the test probe, and extends the service life of the test probe.

In addition, the first groove and the second groove are formed through two etching processes, and the orthographic projection of the second groove on the substrate is located within the orthographic projection of the first groove on the substrate (i.e., the width of the first groove is greater than the width of the second groove in the arrangement direction of the plurality of pads). Thus, the width of the first groove can be greater than or equal to the width of the corresponding pad, thereby widening the opening of the redistribution layer so as to facilitate the test probe to enter the opening and reduce contact between the test probe and the sidewall of the redistribution layer. This prevents contamination or even damage to the testing probe. Moreover, the area where the first groove is located may be a test area for testing the wafer. Since the portion of the substrate under the test area is etched away, the height difference between the top surface of the redistribution layer formed in the first groove and the top surface of the pad is reduced, so is the height of the redistribution layer. This reduces the contact area or movement trajectory of the test probe moving against the sidewall of the redistribution layer, thereby further reducing contamination or even damage to the test probe.

BRIEF DESCRIPTION OF DRAWINGS

One or more embodiments are exemplified by the figures in the accompanying drawings, these exemplary descriptions do not constitute limitations to the embodiments, and unless otherwise specified, the figures in the accompanying drawings do not constitute scale limitations. To more clearly illustrate the technical solutions in the embodiments of the present invention, the accompanying drawings of the embodiments will be briefly introduced below. Obviously, the drawings in the following description are only some embodiments of the present invention. For those of ordinary skill in the art, other drawings can also be obtained from these drawings without any creative effort.

DESCRIPTION OF PREFERRED EMBODIMENTS

In conventional semiconductor techniques, the test probes are susceptible to contamination or damage.

Figure 1:
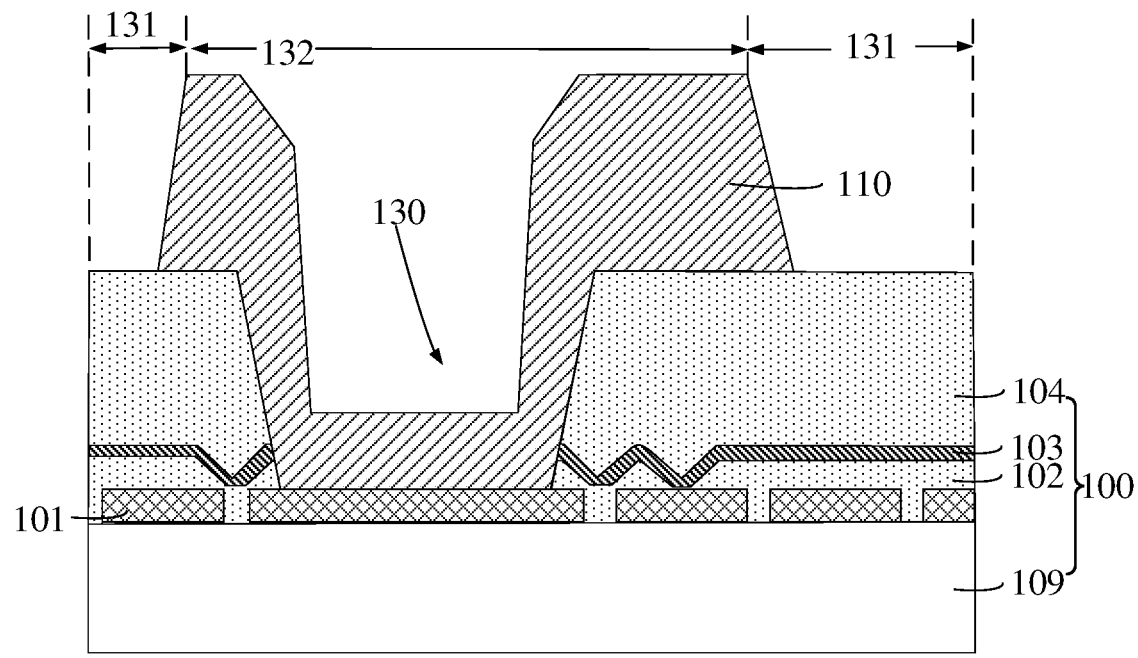
FIG. 1 is a schematic structural view of a semiconductor structure.

FIG. 1 is a schematic structural view of a semiconductor structure. The semiconductor structure of FIG. 1 may include: a substrate 100. The substrate 100 includes a plurality of pads spaced apart from each other in the substrate 100. The substrate 100 further includes an initial substrate 109, a first passivation layer 102, a dielectric layer 103, and a second passivation layer 104. A groove 130 is located in the substrate 100, and the bottom of the groove 130 exposes a corresponding pad 101 of the plurality of pads 101. A redistribution layer 110 is disposed on a surface of the corresponding pad 101, the surface of the substrate 100, and the inner wall and the bottom of the groove 130.

Specifically, to describe a positional relationship between the plurality of pads 101 and the redistribution layer 110, one of the plurality of pads 101 is partially enlarged. It can be understood that the plurality of pads 101 are actually spaced apart from each other, and each of the plurality of pads 101 has the same structure. The plurality of pads 101 serves as test pads (PAD) for the semiconductor structure. In a test process before packaging, test probes of testing equipment pierce the PAD to perform a wafer acceptable test (WAT). That is, the test probes pierce the plurality of pads 101 to perform the WAT test. A plurality of redistribution layers 110 are spaced apart from each other on the substrate 100, and an area between adjacent ones of the redistribution layers 110 is the isolation area 131. An area where each of the redistribution layers 110 is located is the test area 132. The isolation area 131 is configured to achieve electrical isolation between PADs without affecting the test. However, the redistribution layer 110 has a small opening and there is a relatively large height difference between the top surface of the redistribution layer 110 away from the substrate 100 and the top surface of a corresponding pad 101. Specifically, the height difference is greater than 5 microns (μm). The height difference between the redistribution layer 110 and the corresponding pad 101 affects the movement trajectory of the test probe from the isolation area 131 to the test area 132, and the small opening adversely affects the entrance of the test probe to the redistribution layer 110 for the WAT test on the plurality of pads 101. As a result, each of the test probes needs to be inserted into a sidewall at a certain tilting angle. The test probes are located on the same row of a probe card, which causes the inserted depths of the test probes of the probe card into the sidewall to be different. When the test probes are withdrawn, the test probes that are inserted deeper into the sidewall will bring out the debris of the redistribution layer 110, causing contaminations to the test probes or the wafers, and even damage to the test probes.

Embodiments of the present invention provide a semiconductor structure and a method of manufacturing the semiconductor structure to form a first groove and a second groove connected with each other in a substrate by etching the substrate twice. A corresponding pad is exposed at the bottom of the second groove, and the orthographic projection of the second groove on the substrate is located within the orthographic projection of the first groove on the substrate. One more etching process is added, and the width of the first groove formed by the etching is greater than the width of the second groove formed by the etching. An area where the first groove is located may be the area for the test. A portion of the substrate under a redistribution layer is etched away, so that the height difference between the top surface of the redistribution layer and the top surface of the pad is reduced, and the movement trajectory of a test probe from an isolation area to the test area is less restricted. In this way, it is easier for the test probe to be inserted into the redistribution layer connected to the corresponding pad, which alleviates the problem that the test probe cannot be accurately aligned with the corresponding pad.

In addition, the width of the first groove is greater than the width of the second groove, and the first groove and the second groove collectively form a stair step, which facilitates the disposition of a relatively large size of the redistribution layer in the first groove, and further reduces the height difference between the top surface of the redistribution layer and the top surface of the corresponding pad. Furthermore, the height of the redistribution layer on the sidewall is reduced, and the movement path and the contact area of the test probe in contact with the sidewall and the bottom are also reduced, thus reducing contamination or even damage to the test probe. In addition, since the width of the first groove is greater than the width of the second groove, the width of the opening of the redistribution layer located in the first groove is also increased, thus shortening the movement path of the test probe from the isolation area to the test area, and facilitating the entrance of the test probe and reducing the contact between the test probe and the sidewall, which further reduces contamination or even damage to the test probe.

The embodiments of the present invention will be described in detail below with reference to the accompanying drawings. Those of ordinary skill in the art can appreciate that in the various embodiments of the present invention, many technical details are set forth for the reader to better understand the present invention. But even without these technical details and various changes and modifications based on the following embodiments, the technical solutions claimed in the present invention still can be implemented.

Figure 2:
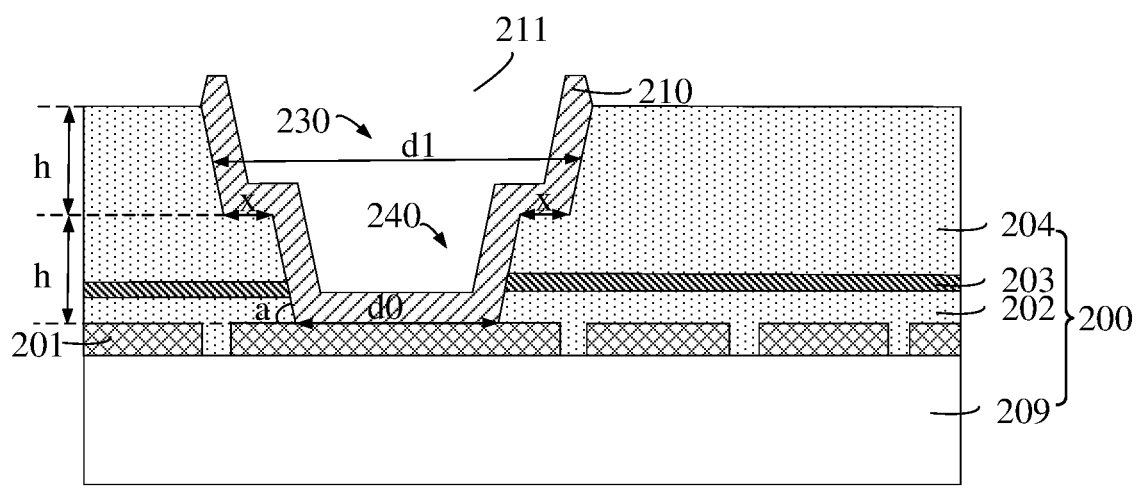
FIG. 2 is a schematic structural view of a scribe line area of a semiconductor structure in accordance with an embodiment of the present invention.
Figure 3:
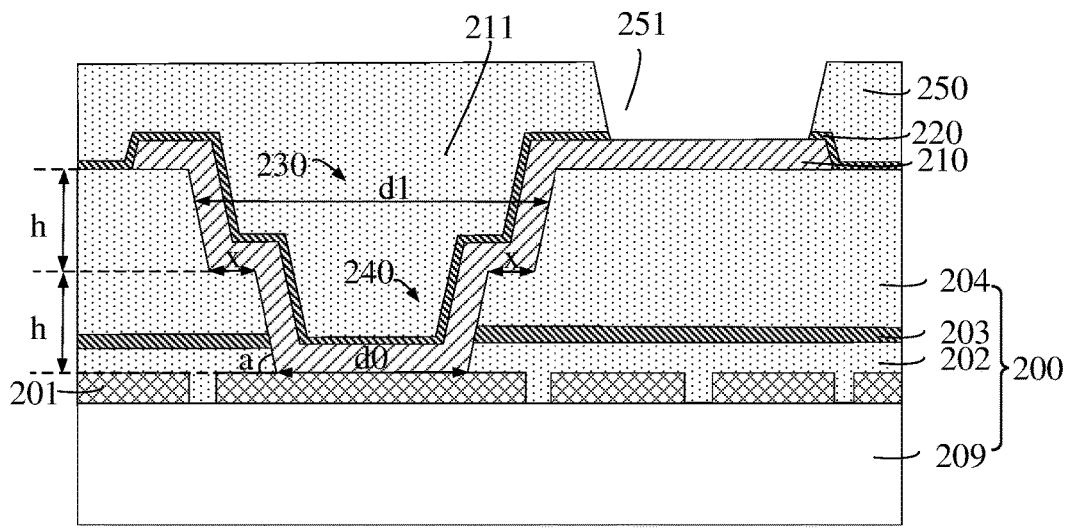
FIG. 3 is a schematic structural view of a chip area of a semiconductor structure in accordance with an embodiment of the present invention.

FIG. 2 is a schematic structural view of a scribe line area of a semiconductor structure in accordance with an embodiment of the present invention. FIG. 3 is a schematic structural view of a chip area of a semiconductor structure in accordance with an embodiment of the present invention.

Referring to FIGS. 2 and 3, the semiconductor structure may include: a substrate 200 including a plurality of pads 201 spaced apart from each other in the substrate 200; a first groove 230 and a second groove 240 connected with each other and located in the substrate 200. The first groove 230 is located on the side of the second groove 240 away from the plurality of pads 201. One corresponding pad 201 of the plurality of pads 201 is exposed at the bottom of the second groove 240. The orthographic projection of the second groove 240 on the substrate 200 is located within the orthographic projection of the first groove 230 on the substrate 200. The semiconductor structure further includes a redistribution layer 210 disposed on the surface of the corresponding pad 201, the inner wall of the first groove 230, and the inner wall and the bottom of the second groove 240.

A wafer includes a chip area and a scribe line area. The chip area and the scribe line area each include specific circuits composed of various semiconductor devices, such as transistors, resistors, and triodes. The scribe line area is used for subsequent dicing the wafer into individual chips. Structures of the semiconductor devices in the chip area may be the same as those in the scribe line area. Performances of the semiconductor devices in the chip area may be simulated or evaluated through the WAT test to the semiconductor devices in the scribe line area to improve the yield of the wafer. Exemplarily, the semiconductor structure provided in the embodiments of the present application may be a semiconductor structure formed in the slicing area and may include the substrate 200 and the plurality of pads 201. The substrate 200 may be provided with various types of semiconductor devices.

In order to describe a positional relationship between the plurality of pads 201 and the redistribution layer 210, one of the plurality of pads 201 may be partially enlarged. The plurality of pads 201 are spaced apart from each other, and each pad 201 has the same structure.

In some embodiments, the substrate 200 may be a stacked multi-layer structure and may have electrical devices, such as transistors, resistors, or capacitors. The plurality of pads 201 can be electrically connected to ports provided in electrical devices through various conductive structures (not shown in the drawings) to apply working voltages/currents and derive test voltages/currents. The plurality of pads 201 may be made of a material such as aluminum, tungsten, or copper, which has small resistance for improved electrical conductivity of the plurality of pads 201 and enhanced electrical conductivity between the plurality of pads 201 and redistribution layers formed subsequently.

In some embodiments, the substrate 200 includes an initial substrate 209, a first passivation layer 202, a dielectric layer 203, and a second passivation layer 204 stacked together. The plurality of pads 201 are located on the initial substrate 209, the first passivation layer 202 covers the surfaces of the plurality of pads 201, and the top surface of the first passivation layer 202 is higher than the top surface of each of the plurality of pads 201.

In some embodiments, the initial substrate 209 is located in the scribe line area. The first passivation layer 202 is made of an insulating material, which electrically isolates the plurality of pads 201 spaced apart from each other. Specifically, in some embodiments, the first passivation layer 202 may be made of silicon oxide. In other embodiments, the first passivation layer 202 may be made of silicon nitride or silicon carbide.

In some embodiments, the dielectric layer 203 is made of silicon nitride and serves as an etching stop layer for preventing excessively etching in subsequent steps, which affects the reliability of the semiconductor structure. The second passivation layer 204 and the first passivation layer 202 may be made of the same material. In other embodiments, the dielectric layer 203 may also be made of an insulating material, such as silicon oxide, silicon carbide, or other high dielectric constant material. The second passivation layer 204 and the first passivation layer 202 may be made of different materials.

The embodiments of the present invention do not limit the specific film layers in the substrate 200 (e.g., the initial substrate 209, the first passivation layer 202, the dielectric layer 203, and the second passivation layer 204). For example, the substrate 200 may have only the first passivation layer covering the plurality of pads 201 on the initial substrate 209.

In some embodiments, the first groove 230 and the second groove 240 serve as a process basis for forming the redistribution layer 210. The redistribution layer 210 may be located on the inner wall of the first groove 230, the inner wall and the bottom of the second groove 240. The first groove 230 and the second groove 240 are connected with each other, and the orthographic projection of the second groove 240 on the substrate 200 is located within the orthographic projection of the first groove 230 on the substrate 200. The first groove 230 and the second groove 240 collectively form a stair step, which facilitates the disposition of a relatively large size of the redistribution layer 210 in the first groove 230 and reduces the height difference between the top surface of the redistribution layer 210 and the top surface of a corresponding pad 201. That facilitates the movement trajectory of the test probe from an area where the redistribution layer 210 is not located to an area where the redistribution layer 210 is located, thus allowing an easier entrance of the test probe to the space confined by the redistribution layer 210 connected to the corresponding pad 201. As the height of the redistribution layer 210 reduces, the movement path of the test probe from the sidewall to the bottom is also reduced, thereby reducing contamination or even damage to the test probe.

In some embodiments, in the direction perpendicular to the surface of the substrate 200, each of the first groove 230 and the second groove 240 has a cross-sectional pattern of a circle, a square, a rectangle, or a trapezoid. The cross-sectional pattern of the first groove 230 and the cross-sectional pattern of the second groove 240 may be trapezoidal. That is, the inner wall surface of the first groove 230 and the inner wall surface of the second groove 240 may both be inclined surfaces. The surface of the redistribution layer 210 formed on the inner wall surface of the first groove 230 and the inner wall surface of the second groove 240 may be an inclined surface. The inclined surface guides the test probe in its extending direction, allowing the test probe to easily enter the opening 211 confined by the redistribution layer 210, which improves the accuracy of test data.

In addition, the cross-sectional pattern of the first groove 230 may be trapezoidal, and may be the same as the cross-sectional pattern of the second groove 240. The first groove 230 has a relatively large volume to accommodate a larger part of the redistribution layer 210, which reduces the height difference between the top surface of the redistribution layer 210 and the top surface of the corresponding pad 201. Thus, the movement path of the test probe from the sidewall to the bottom is reduced, thereby reducing contamination or even damage to the test probe.

The opening 211 confined by the redistribution layer 210 in the first groove 230 is enlarged, so that the movement path of the test probe from the area where the redistribution layer 210 is not located to the area where the redistribution layer 210 is located is reduced, which allows an easier entrance of the test probe to the opening. Hence, the contact between the test probe and the sidewall is reduced, thereby reducing contamination or even damage to the test probe. In some embodiments, one of the cross-sectional patterns of the first groove or the cross-sectional patterns of the second groove may be a trapezoid.

In some embodiments, the central axis of the first groove 230, the central axis of the second groove 240, and the central axis of the corresponding pad 201 may coincide. In the direction oriented from the first groove 230 toward the second groove 240, the depth of the first groove 230 may be greater than or equal to the depth of the second groove 240.

Referring to FIG. 2 or 3, the width of the first groove 230 is d1=d0+2*h/tan(a)+2x in an arrangement direction of the plurality of pads, where d0 is the width of a mask opening for etching the second groove (i.e., the width of the bottom of the second groove 240), h is the depth of the second groove 240, a is the minimum angle defined by the inner wall surface and the bottom of the second groove 240, and x is the width of the stair step formed by the first groove 230 and the second groove 240. Since the etching may be isotropic etching, the sidewall of the first groove 230 and the sidewall of the second groove 240 are also etched, thereby forming a trapezoid. Therefore, d0 corresponds to the minimum width of the second groove 240, and d1 corresponds to the minimum width of the first groove 230. The width of the first groove 230 may be greater than or equal to d1.

In one example, the width d0 of the bottom of the second groove 240 is 3 μm, the depth h of the second groove 240 is 4 μm, the width x of the stair step formed by the first groove 230 and the second groove 240 is 1 μm, and the minimum angle α defined by the inner wall surface and the bottom of the second groove 240 is 45°, so that the first groove) d1=3+2*4/tan(45°)+2*1=13 (μm).

In some embodiments, in the direction oriented from the first groove 230 toward the second groove 240, the depth of the first groove 230 may be greater than the depth of the second groove 240. The area of the first groove 230 may be a test area for the WAT test, and the area outside the first groove 230 may be an isolation area for the WAT test. Since the height difference between the surface of the substrate 200 at the bottom of the first groove 230 and the surface of the substrate 200 at the bottom of the second groove 240 becomes smaller, the movement trajectory of the test probe from the isolation area to the test area is less restricted, allowing an easier entrance of the test probe to the redistribution layer 210 connected to the corresponding pad 201. As the height difference between the top surface of the redistribution layer 210 and the top surface of the pad 201 decreases, the height of the redistribution layer 210 is also reduced, thus reducing contamination or even damage to the test probe.

In some embodiments, the semiconductor structure may include: at least two first grooves 230 arranged in the direction perpendicular to the surface of the substrate 200. In addition, in an arrangement direction oriented from the first groove 230 toward the second groove 230, the orthographic projection of one of the first grooves 230 on the substrate 200 may be located within the orthographic projection of another one of the first grooves 230 located away from the second groove 240 and adjacent to the one of the first grooves 230 on the substrate 200. At least one first stair step may be formed between adjacent ones of the first grooves 230, so that the first grooves 230 may accommodate more of the redistribution layer 210, thereby reducing the height difference between the top surface of the redistribution layer 210 and the top surface of a corresponding pad 201. That allows an easier entrance of the test probe to the space confined by the redistribution layer 210 connected to the corresponding pad 201. With the decrease in the height of the redistribution layer 210, the movement path of the test probe from the sidewall to the bottom is also reduced, thus reducing contamination or even damage to the test probe.

In some embodiments, the redistribution layer 210 is located on the top surface and the sidewall of the second passivation layer 204 and the sidewalls of the dielectric layer 203 and the first passivation layer 202. The bottom of the redistribution layer 210 is connected to the pad 201. The thickness of the redistribution layer 210 at the bottom of the second groove 240 is greater than 1 μm. Such a thickness range of the redistribution layer 210 not only ensures a larger cross-sectional area of the redistribution layer 210, but also reduces square resistance of the redistribution layer 210, which reduces the loss of total output of the semiconductor structure. The thickness range of the redistribution layer 210 ensures that the redistribution layer 210 is sufficiently thick to withstand stress generated by test equipment detecting the redistribution layer in a post-package testing process, or stress generated between a re-formed pad and a packaging substrate in a chip bonding process or between pads in a chip packaging process, thereby preventing the semiconductor structure from stress-induced damage.

In some embodiments, the depth of the second groove 240 may be less than or equal to 1 μm. The redistribution layer 210 may be located on the inner wall and the bottom of the first groove 230, and the redistribution layer 210 may fill the second groove 240, so that the thickness of the redistribution layer 210 at the bottom of each of the first groove 230 and the second groove 240 is greater than 1 μm.

In some embodiments, the redistribution layer 210 may be made of a material selected from any one or more of aluminum, titanium, and titanium nitride, which has low hardness and is easy to be processed during a subsequent packaging process, and also has a lower cost in comparison to the redistribution layer 210 made of gold.

In some embodiments, in the direction perpendicular to the surface of the substrate 200, the cross-sectional pattern of the opening 211 surrounded by the redistribution layer 210 is a trapezoid. That is, the inner wall surface of the opening 211 is an inclined surface. The inclined surface guides the testing probe in its extending direction, allowing an easier entrance of the test probe to the opening 211 confined by the redistribution layer 210, which alleviates the problem that the test probe cannot be accurately aligned with the corresponding pad, thereby improving the accuracy of test data.

In some embodiment, in the extending direction of the pad 201, the ratio of the width at the top of the opening 211 to the width of the pad 201 ranges from 1.5 to 1. Such a width range of the opening 211 confined by the redistribution layer 210 ensures a large area at the top of the opening 211 (i.e., the area above the pad 201), so that the testing probe can be more accurately aligned with the pad, which improves the accuracy of test data. A large area over the pad 201 also facilitates the entrance of the test probe to the opening 211. Thus, the contract between the test probe and the sidewall of the substrate 200 can be reduced, which reduces contamination or even damage to the test probe. The width range of the opening 211 confined by the redistribution layer 210 also prevents the conducting of the redistribution layers 210 in adjacent test areas due to an excessively large width at the top of the opening 211, which results in a failure of electrical isolation and affects the test accuracy of adjacent test areas.

In some embodiments, referring to FIG. 3, the semiconductor structure located in the chip area may further include: an oxide layer 220 formed on the top surface and the side surface of the redistribution layer 210 away from the substrate 200. The oxide layer 220 may be further disposed on the surface of the substrate 200 between adjacent redistribution layers 210. The semiconductor structure may further include a polymer layer 250 filled in the opening 211 and located on the oxide layer 220. The polymer layer 250 may have a first opening 251 extending through the whole polymer layer 250. The bottom of the first opening 251 may expose the redistribution layer 210. The position of the first opening 251 may be different from that of the opening 211.

The oxide layer 220 may be made of an insulating material for isolating the redistribution layers 210 spaced apart from each other. Specifically, in some embodiments, the oxide layer 220 may be made of silicon oxide. In some embodiments, the oxide layer may be made of silicon nitride or silicon carbide.

The polymer layer 250 may be configured to form redistribution pads to meet new pad requirements for the pitch of solder balls. The polymer layer 250 may serve as the medium for a stress buffer during packaging processes. The polymer layer 250 may be made of bisstyrene cycloethylene (BCB) or polyimide (PI). The polymer layer 250 may be a single layer or a stacked multi-layer structure. For example, the polymer layer 250 may include a first polymer layer and a second polymer layer stacked together. The first polymer layer may strengthen the passivation layer of the semiconductor structure (which can be the first passivation layer, the dielectric layer, and the second passivation layer in the substrate) and serve as a buffer for stress. The second polymer layer may be used to planarize the surface of the semiconductor structure and protect the redistribution layer.

In the semiconductor structure in accordance with some embodiments of the present invention, the semiconductor structure may include: a first groove 230 and a second groove 240 connected with each other. The first groove 230 may be located on the side of the second groove 240 away from the plurality of pads 201. A corresponding pad 201 of the plurality of pads 201 may be exposed at the bottom of the second groove 240. The orthographic projection of the second groove 240 on the substrate 200 may be located within the orthographic projection of the first groove 230 on the substrate 200. Thus, in the direction perpendicular to the surface of the substrate 200, the width of the cross-sectional pattern of the first groove 230 is greater than the width of the cross-sectional pattern of the second groove 240, and the stair step is formed by the first groove 230 and the second groove 240.

The first groove 230 and the second groove 240 collectively form a stair step, which facilitates the disposition of a relatively large size of the redistribution layer 210 in the first groove 230 and reduces the height difference between the top surface of the redistribution layer 210 and the top surface of a corresponding pad 201, so that the movement trajectory of a test probe from an area where the redistribution layer 210 is not located to an area where the redistribution layer 210 is located is less restricted. That allows the test probe to easily enter the space confined by the redistribution layer 210 connected to the corresponding pad 201. The height difference between the top surface of the redistribution layer 210 and the top surface of the pad 201 (i.e., the height of the redistribution layer 210 on the sidewall of the substrate 200) is reduced, thereby preventing contamination or damage to the test probe due to the difficulty of puncturing the test probe, and improving the functional reliability and service life of the test probe.

Correspondingly, in another aspect, the embodiments of the present invention further provide a method of manufacturing a semiconductor structure. The manufacturing method can be used to manufacture the semiconductor structure provided in the above embodiments.

FIGS. 4, 5, 6, 7, 8, 9, 10, 11, 12, 13, 14, 15, 16, 17, 18, and 19 are schematic structural views corresponding to respective steps in the method of manufacturing the semiconductor structure in accordance with one or more embodiments of the present invention.

Figure 4:
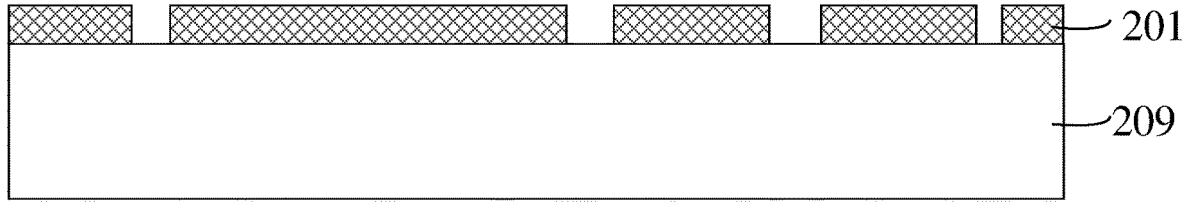
FIGS. 4, 5, 6, 7, 8, 9, 10, 11, 12, 13, 14, 15, 16, 17, 18 and 19 are schematic structural views corresponding to various steps in a method of manufacturing a semiconductor structure in accordance with embodiments of the present invention.
Figure 5:
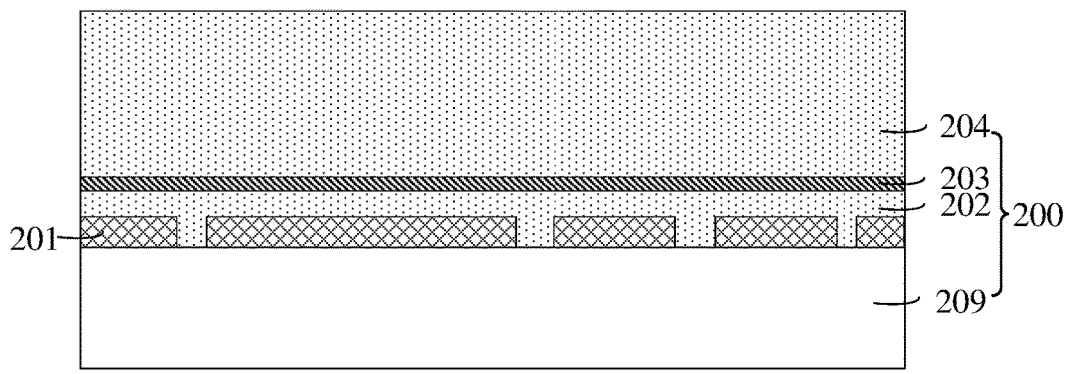

Referring to FIGS. 4 and 5, a substrate 200 is provided. The substrate 200 includes a plurality of pads 201 spaced apart from each other in the substrate 200.

The substrate 200 may be a stacked multi-layer structure and may have electrical devices, such as transistors, resistors, or capacitors, etc. The plurality of pads 201 can be electrically connected to ports provided in electrical devices through various conductive structures (not shown in the drawings) to apply working voltages/currents and derive test voltages/currents.

A wafer includes a chip area and a scribe line area. The chip area and the scribe line area each include specific circuits composed of various semiconductor devices, such as transistors, resistors, and triodes. The scribe line area is used for subsequent dicing the wafer into individual chips. Structures of the semiconductor devices in the chip area may be the same as those in the scribe line area. Performances of the semiconductor devices in the chip area may be simulated or evaluated through the WAT test to the semiconductor devices in the scribe line area to improve the yield of the wafer. Exemplarily, the method of manufacturing the semiconductor structure provided in the embodiments of the present application can form a semiconductor structure in the scribe line area, and the semiconductor structure may include the substrate 200 and the plurality of pads 201, wherein various types of semiconductor devices are formed in the substrate 200.

Referring to FIG. 4, an initial substrate 209 may first be provided. A plurality of pads 201 spaced apart from each other may be formed on the surface of the initial substrate 209.

In some embodiments, the initial substrate 209 may be located in the scribe line area, and the plurality of pads 201 can serve as pads for the WAT test. The plurality of pads 201 may be made of a material such as aluminum, tungsten, or copper, which has small resistance for improved electrical conductivity of the plurality of pads 201 and enhanced electrical conductivity between the plurality of pads 201 and redistribution layers formed subsequently.

Referring to FIG. 5, a first passivation layer 202, a dielectric layer 203, and a second passivation layer 204 are sequentially formed on the initial substrate 209. The first passivation layer 202 may cover surfaces of the plurality of pads 201. The top surface of the first passivation layer 202 may be higher than the top surface of each of the plurality of pads 201. The initial substrate 209, the first passivation layer 202, the dielectric layer 203, and the second passivation layer 204 may collectively constitute the substrate 200.

The first passivation layer 202 may be made of an insulating material to electrically isolate the plurality of pads 201 spaced apart from each other. Specifically, in some embodiments, the first passivation layer 202 may be made of silicon oxide. In other embodiments, the first passivation layer 202 may be made of silicon nitride or silicon carbide.

In some embodiments, the dielectric layer 203 is made of silicon nitride and serves as an etching stop layer to prevent excessively etching in subsequent steps, which may affect the reliability of the semiconductor structure. The second passivation layer 204 and the first passivation layer 202 may be made of the same material. In other embodiments, the dielectric layer 203 may be made of an insulating material, such as silicon oxide, silicon carbide, or other high dielectric constant material. The second passivation layer 204 and the first passivation layer 202 may be made of different materials.

The specific film layers in the substrate 200 (e.g., the initial substrate 209, the first passivation layer 202, the dielectric layer 203, and the second passivation layer 204) are not limited by the embodiments of the present invention. In some embodiments, there may be only the first passivation layer covering the plurality of pads 201 on the initial substrate 209.

Referring to FIGS. 6, 7, 8, 9, 10, 11, 12, and 13, the substrate 200 may be patterned to form a first groove 230 and a second groove 240 connected with each other in the substrate 200. The first groove 230 may be formed on the side of the second groove 240 away from the plurality of pads 201. A corresponding pad 201 of the plurality of pads 201 may be exposed at the bottom of the second groove 240. The orthographic projection of the second groove 240 on the substrate 200 is located within the orthographic projection of the first groove 230 on the substrate 200.

The first groove 230 and the second groove 240 may serve as a process basis for forming the redistribution layer. Subsequently, the redistribution layer may be formed on the inner wall of the first groove 230, the inner wall of the second groove 240, and the surface of the exposed pad 201.

In some embodiments, the first groove 230 and the second groove 240 are connected with each other. The orthographic projection of the second groove 240 on the substrate 200 is located within the orthographic projection of the first groove 230 on the substrate 200. The first groove 230 and the second groove 240 collectively form a stair step. The stair step facilitates the disposition of a relatively large size of the redistribution layer 210 in the first groove 230 and reduces the height difference between the top surface of the redistribution layer 210 and the top surface of a corresponding pad 201, so that the movement trajectory of the test probe from an area where the redistribution layer is not located to an area where the redistribution layer is located is less restricted. That allows an easier entrance of the test probe to the space confined by the redistribution layer connected to the corresponding pad 201. As the height difference between the top surface of the redistribution layer 210 and the top surface of the pad 201 decreases, the height of the redistribution layer 210 is also reduced, so is the movement path of the test probe from the sidewall to the bottom, thereby reducing contamination or even damage to the test probe.

In some embodiments, the central axis of the first groove 230, the central axis of the second groove 240, and the central axis of the corresponding pad 201 may coincide. In the direction oriented from the first groove 230 toward the second groove 240, the depth of the first groove 230 may be greater than or equal to the depth of the second groove 240.

Figure 9:
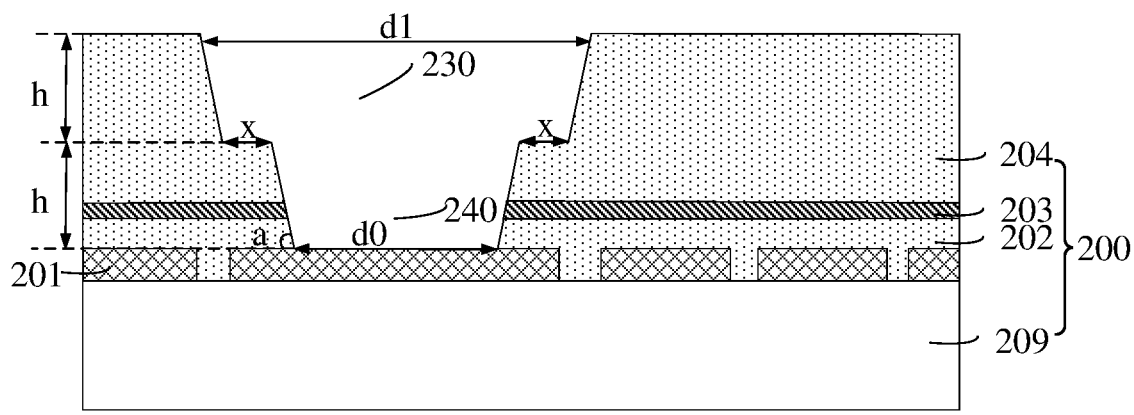
Figure 13:
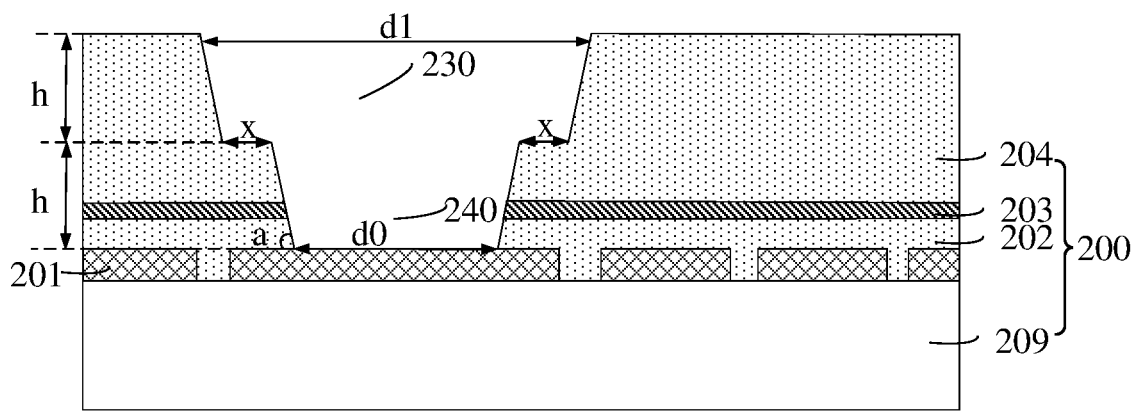

Referring to FIG. 9 or 13, the width of the first groove 230 maybe $d1=d0+2*h/\tan(a)+2x$, wherein d0 is the width of the first opening 206 of the first mask layer 205 (referring to FIG. 6) or the width of the third opening 226 of the third mask layer 225 (referring to FIG. 10), or, in other words, the width of the bottom of the second groove 240. h is the depth of the second groove 240, a is the minimum angle formed by the inner wall surface and the bottom of the second groove 240, and x is the width of the stair step formed by the first groove 230 and the second groove 240. In the isotropic etching process, the sidewall of the first groove 230 and the sidewall of the second groove 240 are also etched, thereby forming a trapezoid. Therefore, d0 corresponds to the minimum width of the second groove 240, and d1 corresponds to the minimum width of the first groove 230. The width of the first groove 230 may be greater than or equal to d1.

In some embodiments, referring to FIGS. 6, 7, 8, and 9, steps of forming the first groove 230 and the second groove 240 may include: patterning the substrate 200 to form the first groove 230; and etching the substrate 200 exposed at the bottom of the first groove 230 to form the second groove 240.

The steps of forming the first groove 230 and the second groove 240 will be described in detail below with reference to the accompanying drawings.

Figure 6:
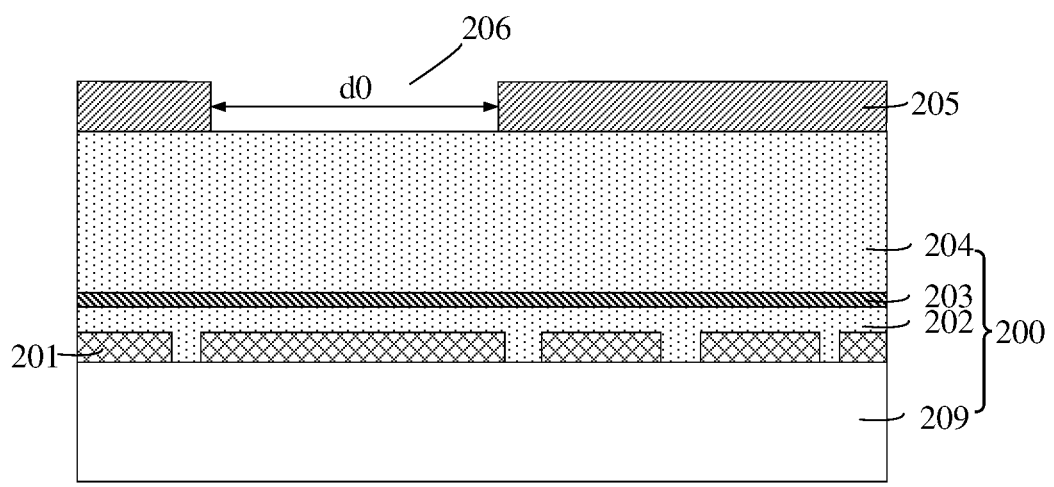

Referring to FIG. 6, the first mask layer 205 may be formed on the top surface of the substrate 200.

In some embodiments, the first mask layer 205 may be formed on the top surface of the second passivation layer 204. The first opening 206 may be formed in the first mask layer 205 and extend through the first mask layer 205. The first mask layer 205 may be a photoresist layer or a hard mask layer. The hard mark layer may be made of silicon nitride, titanium nitride, or silicon oxide.

Figure 7:
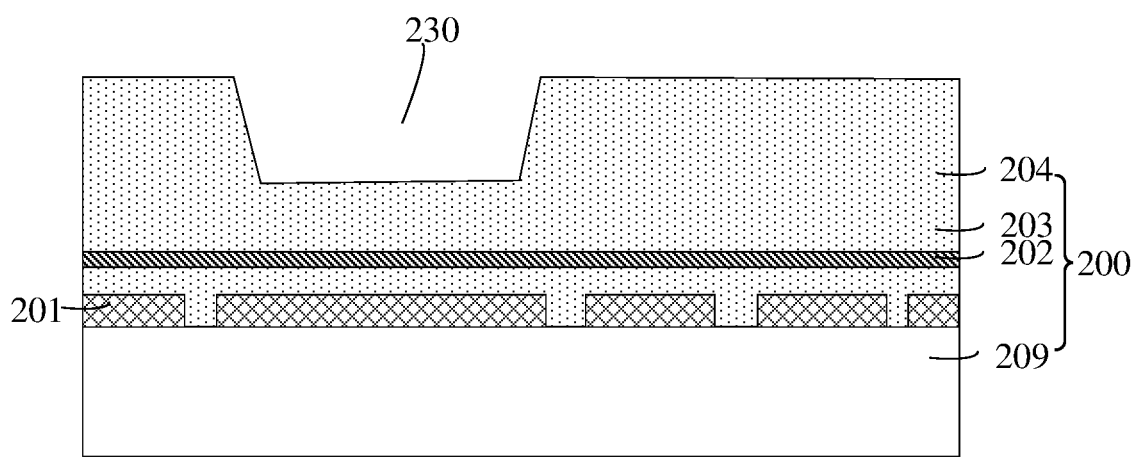

Referring to FIG. 7, the first mask layer 205 (referring to FIG. 6) may be used as a mask when etching the substrate 200 to form the first groove 230.

In some embodiments, the first mask layer 205 may be used as a mask when etching a portion of the second passivation layer 204 along a sidewall of the first opening 206 to the desired depth. The first mask layer 205 may be removed afterwards.

In some embodiments, the second passivation layer and a partial thickness of the dielectric layer are etched to form the first groove. In some embodiments, the second passivation layer and the dielectric layer and a partial thickness of the first passivation layer may be etched to form the first groove.

Figure 8:
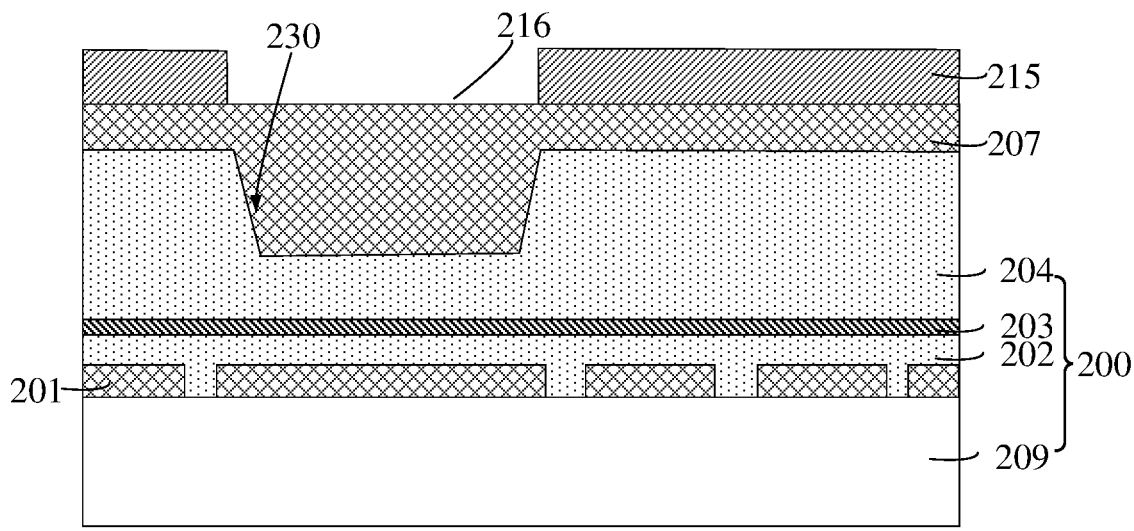

Referring to FIG. 8, the second mask layer 215 may be formed on the top surface of the substrate 200.

The second opening 216 may be formed in the second mask layer 215 and extend through the second mask layer 215. The second opening 216 may define the position of the second groove to be formed subsequently. The second opening 216 may be located over the first groove 230 (referring to FIG. 7). The orthographic projection of the second opening 216 on the surface of the substrate 200 may be located within the orthographic projection of the first groove 230 on the surface of the substrate 200.

To improve the positional accuracy of the second opening 216 in the second mask layer 215, the method may further include: prior to forming the second mask layer 215, forming a first filling layer 207 in the first groove 230, wherein the first filling layer 207 fills the first groove 230 and is further located on the surface of the substrate 200. The first filling layer 207 may provide a relatively flat interface contact for forming the second mask layer 215. Thus, it is not necessary to form the second mask layer 215 in the first groove 230. That allows the second mask layer 215 to be relatively thin, and lowers the process cost.

In some embodiments, the second mask layer 215 may be made of a hard mask material or a photoresist material. The first filling layer 207 may be a bottom anti-reflection layer (BARC). In some embodiments, the second mask layer 215 may also be formed directly on the surface of the substrate 200.

Referring to FIG. 9, the second mask layer 215 (referring to FIG. 8) may be used as a mask when etching the substrate 200 to form the second groove 240.

In some embodiments, the second mask layer 215 may be used as a mask when etching the filling layer 207, the first passivation layer 202, the dielectric layer 203, and the second passivation layer 204 along the sidewall of the second opening 216 to form the second groove 240. The second mask layer 215 and the first filling layer 207 may be removed afterwards.

In some embodiments, referring to FIGS. 6, 7, 8, and 9, the first opening 206 and the second opening 216 may have the same size. That is, the first mask layer 205 and the second mask layer 215 may be the same. When the substrate 200 is etched for the second time, since the etching may be isotropic etching, the sidewall of the first groove 230 is etched, and the width of the first groove 230 finally formed may be greater than the width of the second groove 240.

In some embodiments, the first groove 230 is formed before the second groove 240 is formed. In some embodiments, the second groove 240 may be formed before the first groove 230 is formed.

Referring to FIGS. 10, 11, 12, and 13, the steps of forming the first groove 230 and the second groove 240 may include: patterning the substrate 200 to form a first trench 260 having a bottom exposing a corresponding pad 201; and etching a portion of the substrate 200 outside the first trench 260 to the desired depth to increase the size of a portion of the first trench 260 to form the first groove 230, wherein a remaining portion of the first trench 260 serves as the second groove 240.

Figure 10:
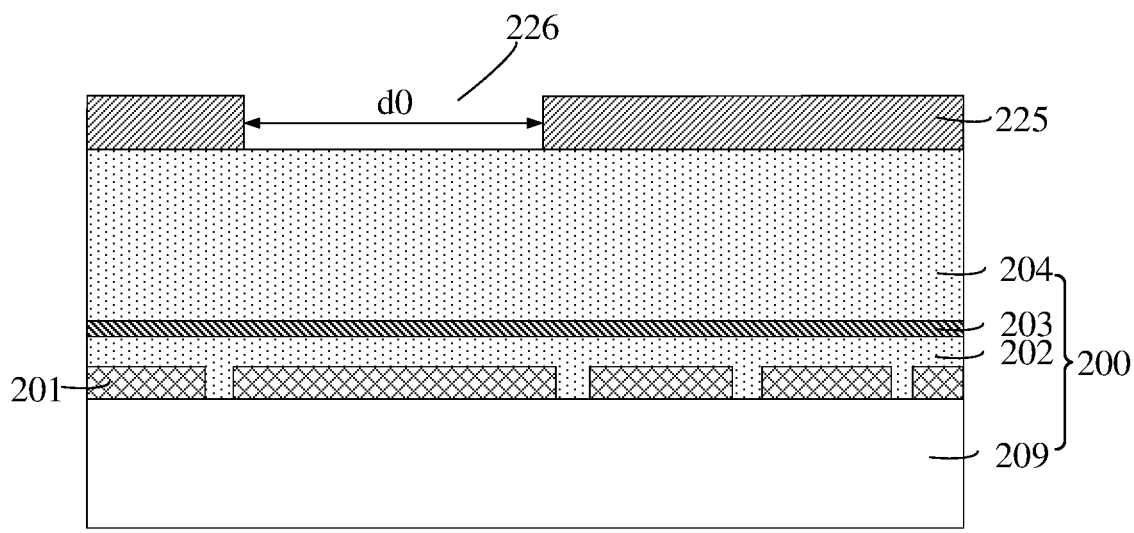

Referring to FIG. 10, a third mask layer 225 may be formed on the top surface of the substrate 200.

In some embodiments, the third mask layer 225 may be formed on the top surface of the second passivation layer 204, and the third opening 226 may be formed in the third mask layer 225 and extend through the third mask layer 225. The third mask layer 225 may be a photoresist or a hard mask layer. The hard mask layer may be made of silicon nitride, titanium nitride, or silicon oxide.

Figure 11:
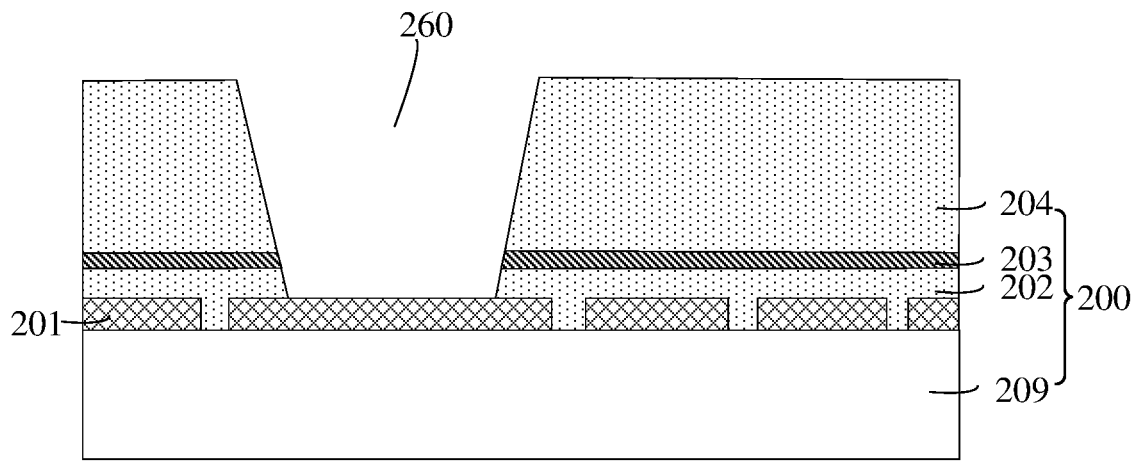

Referring to FIG. 11, the third mask layer 225 (referring to FIG. 10) may be used as a mask when etching the substrate 200 to form the first trench 260.

In some embodiments, the third mask layer 225 may be used as a mask for etching the second passivation layer 204, the dielectric layer 203, and a partial thickness of the first passivation layer 202 along a sidewall of the third opening 226 to form the first trench 260. The third mask layer 225 may be removed afterwards.

Figure 12:
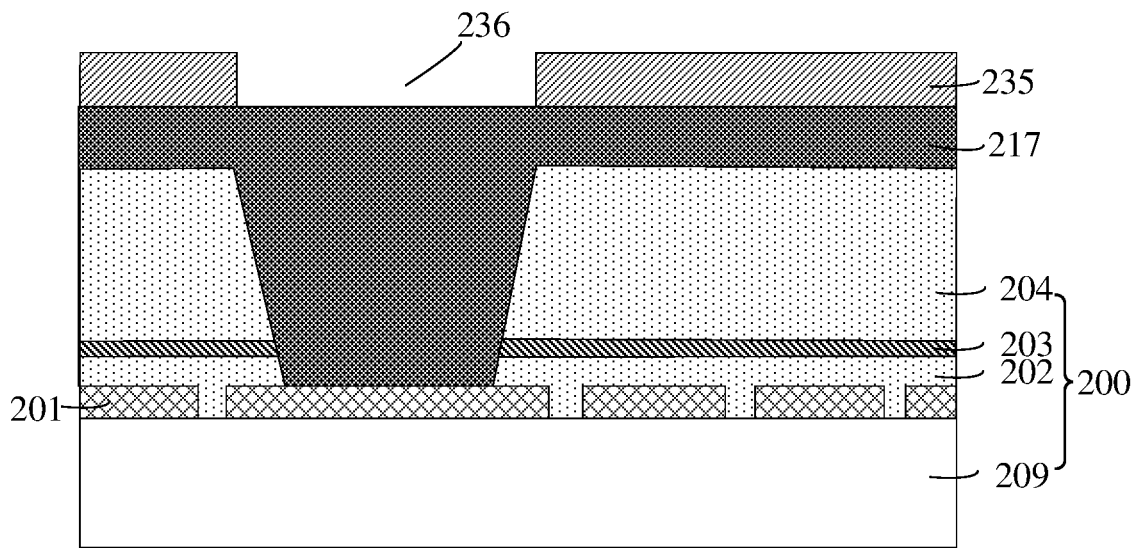

Referring to FIG. 12, a fourth mask layer 235 may be formed on the top surface of the substrate 200.

In some embodiments, the fourth opening 236 may be formed in the fourth mask layer 235 and extend through the fourth mask layer 235. The fourth opening 236 may be used to define the position of the first groove to be formed subsequently. The fourth opening 236 may be located over the first trench 260 (referring to FIG. 11). The orthographic projection of the first trench 260 on the surface of the substrate 200 may be located within the orthographic projection of the fourth opening 236 on the surface of the substrate 200.

To improve the positional accuracy of the fourth opening 236 in the fourth mask layer 235, the method may further include: prior to forming the fourth mask layer 235, forming a second filling layer 217 in the first trench 260, wherein the second filling layer 217 fills the first groove 260 and is located on the surface of the substrate 200. The second filling layer 207 may provide a relatively flat interface contact for the formation of the fourth mask layer 235. Thus, it is not necessary to form the fourth mask layer 215 in the first trench 260. That allows the fourth mask layer 235 to be relatively thin, and lowers the process cost.

In some embodiments, the fourth mask layer 235 may be made of a hard mask material or a photoresist material. The second filling layer 217 may be a bottom anti-reflection layer.

In some embodiments, the fourth mask layer 235 may be formed directly on the surface of the substrate 200.

Referring to FIG. 13, the fourth mask layer 235 (referring to FIG. 12) may be used as a mask when etching a portion of the substrate 200 outside the first trench 260 to the desired depth to form the first groove 230.

In some embodiments, the fourth mask layer 235 may be used as a mask for etching a partial thickness of the first passivation layer 202 along a sidewall of the fourth opening 236 to form the first groove 230. A remaining portion of the first trench 260 serves as the second groove 240. The fourth mask layer 235 and the second filling layer 217 may be removed afterwards.

In some embodiments, referring to FIGS. 10, 11, 12, and 13, the third opening 226 and the fourth opening 236 may have the same size. That is, the third mask layer 225 and the fourth mask layer 235 may be the same. When the substrate 200 is etched for the second time, since the etching may be isotropic etching, the sidewall of the first trench 260 may be etched, and the width of the first groove 230 finally formed may be greater than the width of the second groove 240.

In some embodiments, the method of manufacturing the semiconductor structure may further include: repeating the steps described above, such as those illustrated in FIG. 6, 7, 12 or 13, to form a plurality of connected first grooves 230. In addition, in an arrangement direction oriented from the first groove 230 toward the second groove 230, the orthographic projection of one of the first grooves 230 on the substrate 200 is located within the orthographic projection of another one of the first grooves 230 located away from the second groove 240 and adjacent to the one of the first grooves 230 on the substrate 200.

Figure 14:
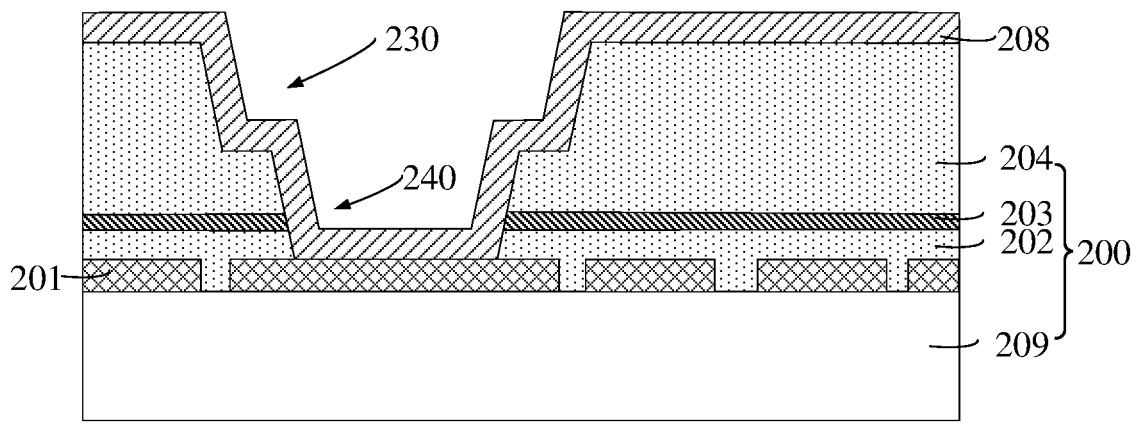
Figure 15:
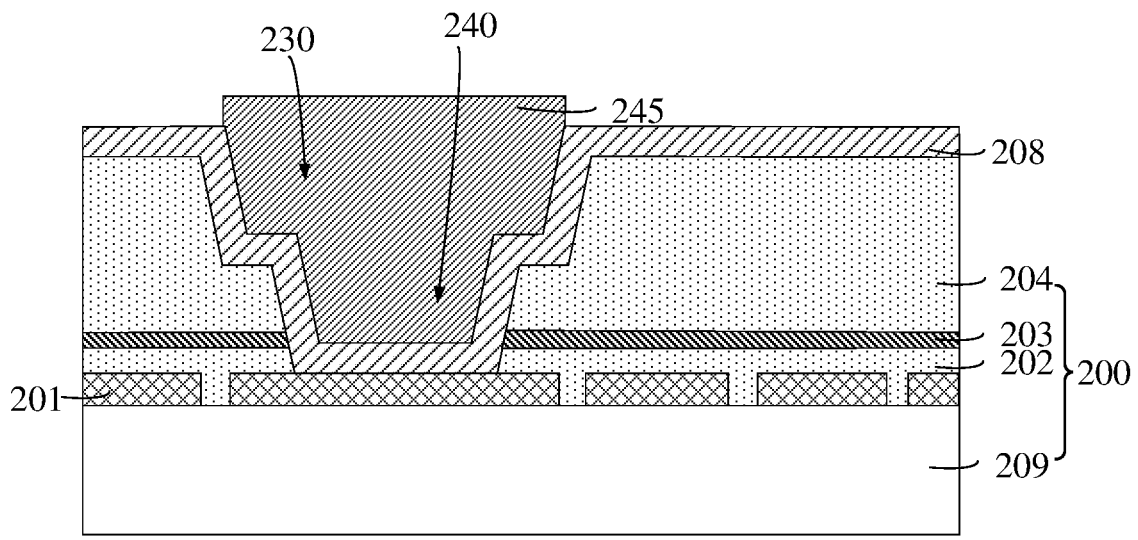
Figure 16:
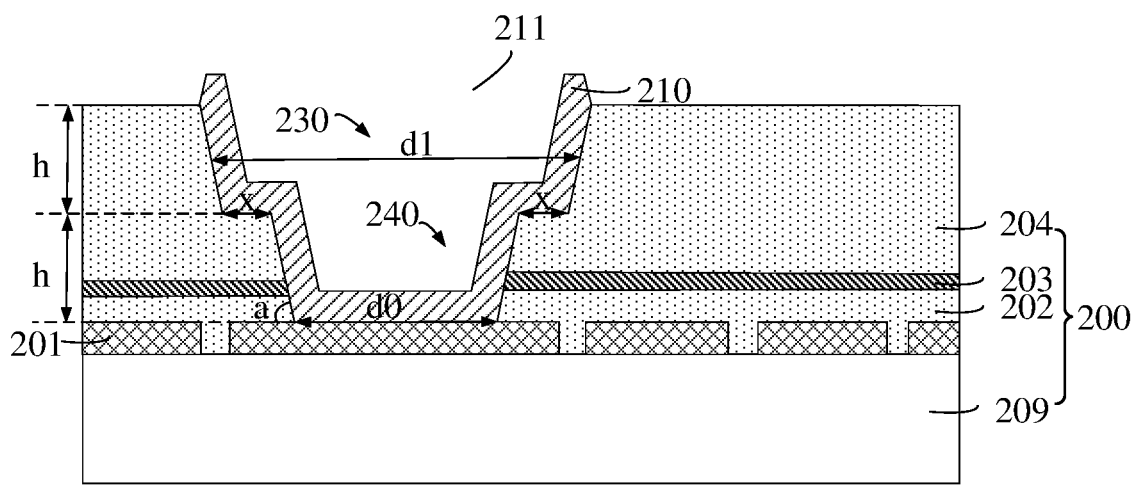

Referring to FIGS. 14, 15, and 16, the redistribution layer 210 may be formed. The redistribution layer 210 may be formed on the surface of the corresponding pad 201, the inner wall of the first groove 230, and the inner wall and the bottom of the second groove 240.

In some embodiments, the thickness of the redistribution layer 210 at the bottom of the second groove 240 may be greater than 1 μm. Such a thickness range of the redistribution layer 210 not only ensures a larger cross-sectional area of the redistribution layer 210, but also reduces square resistance of the redistribution layer 210, which reduces the loss of total output of the semiconductor structure. The thickness range of the redistribution layer 210 also ensures that the redistribution layer 210 is sufficiently thick to withstand stress generated by test equipment detecting the redistribution layer in a post-package testing process, or stress generated between a re-formed pad and a packaging substrate in a chip bonding process or between pads in a chip packaging process, thereby preventing the semiconductor structure from stress-induced damage.

In some embodiments, the depth of the second groove 240 may be less than or equal to 1 μm. The redistribution layer 210 may further cover the inner wall and the bottom of the first groove 230, and fill the second groove 240. The thickness of the redistribution layer 210 at the bottom of each of the first groove 230 and the second groove 240 may be greater than 1 μm.

The steps of forming the redistribution layer 210 will be described in detail below with reference to the accompanying drawings.

Referring to FIG. 14, a continuous conductive film 208 may be formed. The continuous conductive film 208 may cover the inner wall of the first groove 230, the inner wall and the bottom of the second groove 240, and the top surface of the substrate 200.

The continuous conductive film 208 may be formed by a vapor deposition process and cover the top surface and sidewall of the second passivation layer 204 and the sidewalls of the dielectric layer 203 and the first passivation layer 202. The bottom of the conductive film 208 may be connected to the corresponding pad 201, and the conductive film 208 may be made of a material selected from any one or more of aluminum, titanium, or titanium nitride.

Referring to FIG. 15, a plurality of fifth mask layers 245 spaced apart from each other may be formed. Each of the fifth mask layers 245 is located on the top surface of the conductive film 208 away from the second passivation layer 204. A portion of the top surface of the conductive film 208 is exposed between adjacent ones of the fifth mask layers 245. The fifth mask layer 245 may be made of the same material of the first mask layer 205.

Referring to FIG. 16, the conductive film 208 on the top surface of the substrate 200 may be etched, and a remaining portion of the conductive film 208 may serve as the redistribution layer 210.

The fifth mask layer 235 may be used as a mask when etching a portion of the conductive film 208 until the top surface of the second passivation layer 204 is exposed, so that a plurality of the redistribution layers 210 spaced apart from each other is formed. The fifth mask layer 235 may be removed afterwards.

The method of manufacturing the semiconductor structure provided in the embodiment of the present application may also include fabricating a semiconductor structure in the chip area, wherein the method of forming the first groove, the second groove, and the redistribution layer is the same as or similar to the method of manufacturing the semiconductor structure provided in the above-mentioned embodiments (FIGS. 4 to 16), which will not be repeatedly described herein.

Figure 17:
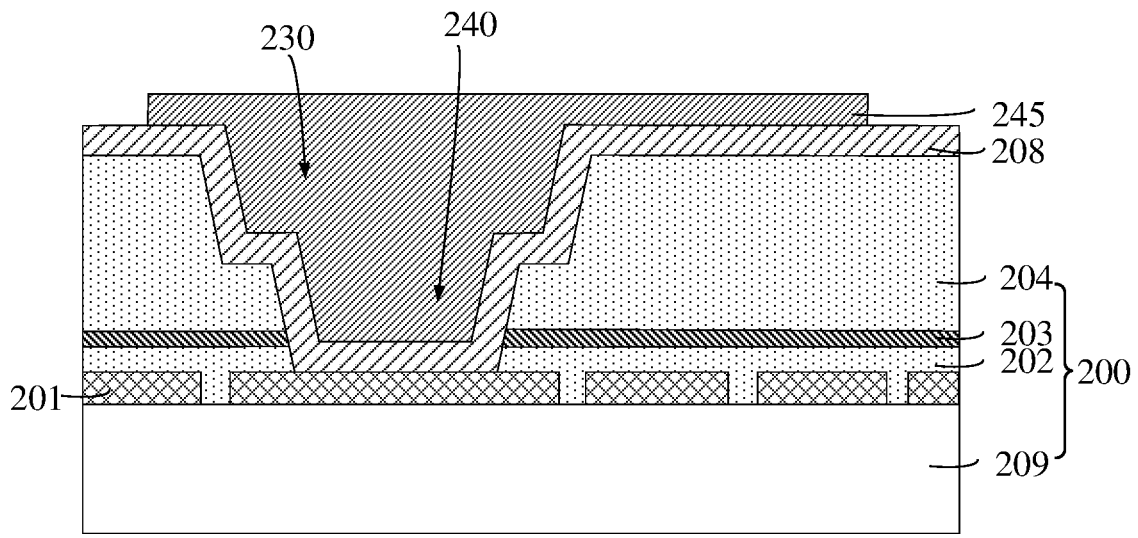
Figure 18:
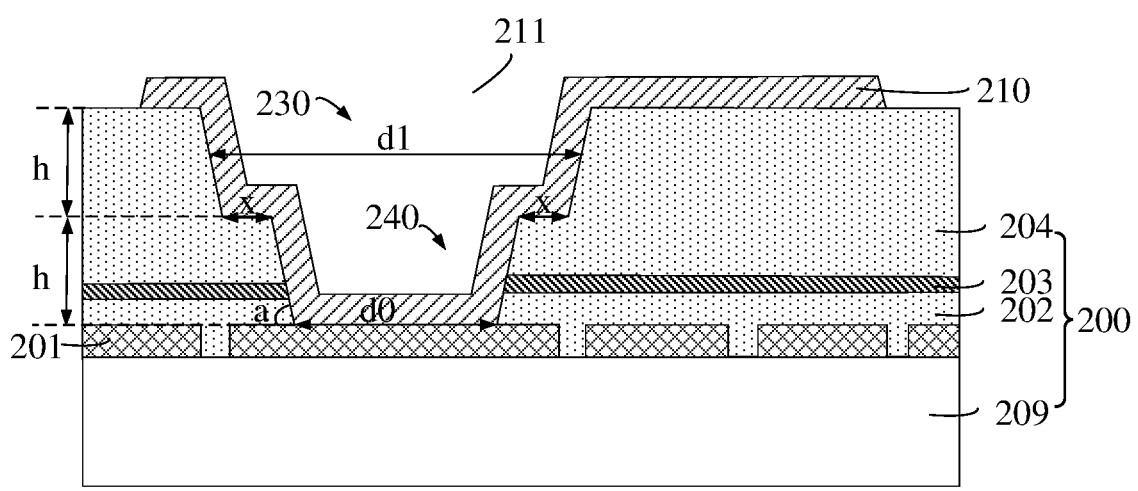

The structure of the fifth mask layer 245 located in the chip area (as shown in FIG. 17) may be different from that of the fifth mask layer 245 located in the scribe line area (as shown in FIG. 14). That is, the structure of the redistribution layer 210 (as shown in FIG. 18) formed in the chip area and the structure of the redistribution layer 210 (as shown in FIG. 16) formed in the scribe line area may be different. Referring to FIG. 18, the redistribution layer 210 of the semiconductor structure in the chip area may further cover the surface of the substrate 200.

Figure 19:
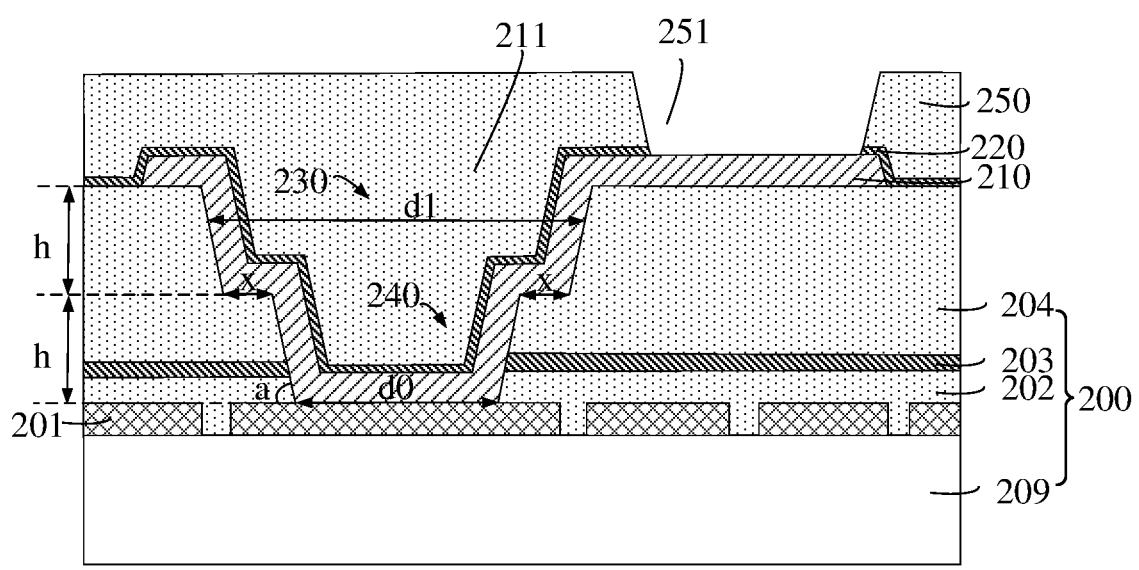

Referring to FIG. 19, an oxide layer 220 may be formed. The oxide layer 220 may cover the top surface and the side surface of the redistribution layer 210 away from the substrate 200.

The oxide layer 220 may also cover the surface of the substrate 200 between adjacent ones of the redistribution layers 210. The oxide layer 220 may be made of an insulating material for isolating the redistribution layers 210 spaced apart from each other. Specifically, in some embodiments, the oxide layer 220 may be made of silicon oxide. In some embodiments, the oxide layer may be made of silicon nitride or silicon carbide.

Referring to FIG. 19, a polymer layer 250 may be formed. The polymer layer 250 may fill the opening 211 and cover the oxide layer 220. The first opening 251 may be formed in the polymer layer 250 and extend through the whole polymer layer 250. The bottom of the first opening 251 may expose the redistribution layer 210, and the position of the first opening 251 may be different from that of the opening 211.

The polymer layer 250 may be configured to form re-layout pads to meet the new pad requirements for solder ball pitches. The polymer layer 250 may serve as a stress buffer medium for packaging processes. The polymer layer 250 may be made of bisstyrene cycloethylene (BCB) or polyimide (PI). The polymer layer 250 may be a single layer or a stacked multi-layer structure. For example, the polymer layer 250 may include a first polymer layer and a second polymer layer stacked together. The first polymer layer may strengthen the passivation layer of the semiconductor structure (which can be the first passivation layer, the dielectric layer, and the second passivation layer in the substrate) and serve as a buffer for stress. The second polymer layer may be used to planarize the surface of the semiconductor structure and protect the redistribution layer 210.

Those skilled in the art can understand that the above embodiments are specific examples for realizing the present invention, and in practical applications, various changes in form and details can be made without departing from the spirit and the scope of the present invention. Any person skilled in the art can make various changes and modifications without departing from the spirit and scope of the present invention. Therefore, the protection scope of the present invention should be based on the scope defined by the claims.

What is claimed is:

1. A semiconductor structure, comprising:
   a substrate comprising a plurality of pads spaced apart from each other in the substrate;
   a first groove;
   a second groove connected with the first groove, the first and the second grooves located in the substrate, wherein the first groove is located on a side of the second groove away from the plurality of pads, a bottom of the second groove exposes a corresponding pad of the plurality of pads, and an orthographic projection of the second groove on the substrate is located within an orthographic projection of the first groove on the substrate; and
   a redistribution layer disposed on a surface of the corresponding pad, an inner wall of the first groove, and an inner wall and the bottom of the second groove,
   wherein the redistribution layer comprises aluminum, titanium, or titanium nitride;
   wherein a top surface of the redistribution layer in the first groove and the second groove is exposed;
   wherein the redistribution layer, the first groove, the second groove, and the corresponding pad are located at a scribe line area; and
   wherein the substrate comprises an initial substrate, a first passivation layer, a dielectric layer, and a second passivation layer stacked in sequence, and wherein the plurality of pads are located on the initial substrate, the first passivation layer covers surfaces of the plurality of pads, and a top surface of the first passivation layer is higher than a top surface of each of the plurality of pads.

2. The semiconductor structure of claim 1, wherein in a direction perpendicular to a surface of the substrate, at least one of the first groove and the second groove has a cross-sectional pattern of a circle, a square, a rectangle, or a trapezoid.

3. The semiconductor structure of claim 1, wherein a central axis of the first groove, a central axis of the second groove, and a central axis of the corresponding pad coincide.

4. The semiconductor structure of claim 1, wherein the semiconductor structure comprises at least two first grooves arranged in a direction perpendicular to a surface of the substrate, wherein in a direction oriented from the first grooves toward the second groove, an orthographic projection of one of the first grooves on the substrate is located within an orthographic projection of another one of the first grooves located away from the second groove and adjacent to the one of the first grooves on the substrate.

5. The semiconductor structure of claim 1, wherein a thickness of the redistribution layer located at the bottom of the second groove is greater than one micron (μm).

6. The semiconductor structure of claim 1, wherein in a direction oriented from the first groove toward the second groove, a depth of the first groove is greater than or equal to a depth of the second groove.

7. The semiconductor structure of claim 6, wherein the depth of the first groove is equal to the depth of the second groove, and a width of the first groove is d1=d0+2*h/tan(a)+2x in an arrangement direction of the plurality of pads, where do is a minimum width of the second groove, h is the depth of the second groove, a is a minimum angle defined by an inner wall surface of the second groove and the bottom of the second groove, and x is a width of a stair step defined by the first groove and the second groove.

8. The semiconductor structure of claim 1, wherein the redistribution layer forms an opening having a cross-sectional pattern of a trapezoid in a direction perpendicular to a surface of the substrate.

9. The semiconductor structure of claim 8, wherein in an arrangement direction of the plurality of pads, a ratio of a width of a top of the opening to a width of the corresponding pad ranges from 1.5 to 1.

10. A method of manufacturing the semiconductor structure of claim 1, comprising:
providing the substrate comprising the plurality of pads spaced apart from each other;
patterning the substrate to form the first groove and the second groove connected with the first groove; and
forming the redistribution layer on the surface of the corresponding pad, the inner wall of the first groove, and the inner wall and the bottom of the second groove.

11. The method of claim 10, wherein forming the redistribution layer on the surface of the corresponding pad comprises:
forming a continuous conductive film on the inner wall of the first groove, the inner wall and the bottom of the second groove, and a top surface of the substrate; and
etching a portion of the conductive film on the top surface of the substrate, so that a remaining portion of the conductive film serves as the redistribution layer.

12. The method of claim 10, wherein providing the substrate comprising the plurality of pads spaced apart from each other comprises:
providing the initial substrate;
forming the plurality of pads spaced apart from each other on a surface of the initial substrate; and
forming a first passivation layer, a dielectric layer, and a second passivation layer sequentially stacked on the initial substrate, wherein the first passivation layer covers surfaces of the plurality of pads, and wherein the initial substrate, the first passivation layer, the dielectric layer, and the second passivation layer collectively serve as the substrate.

13. The method of claim 10, wherein patterning the substrate to form the first groove and the second groove connected with the first groove comprises:
patterning the substrate to form the first groove; and
etching a portion of the substrate exposed at a bottom of the first groove to form the second groove.

14. The method of claim 13, further comprising:
prior to forming the first groove, forming a first mask layer on a top surface of the substrate; and
etching the substrate using the first mask layer to form the first groove, and
prior to forming the second groove, forming a second mask layer on the top surface of the substrate; and
etching the substrate using the second mask layer to form the second groove.

15. The method of claim 10, wherein patterning the substrate to form the first groove and the second groove connected with the first groove comprises:
patterning the substrate to form a first trench having a bottom exposing the corresponding pad; and
etching a portion of the substrate outside the first trench to a desired depth to expand a portion of the first trench to form the first groove, wherein a remaining portion of the first trench serves as the second groove.

16. The method of claim 15, further comprising:
prior to forming the first trench, forming a third mask layer on a top surface of the substrate; and
etching, using the third mask layer, the substrate to form the first trench, and
prior to forming the first groove, forming a fourth mask layer formed on the top surface of the substrate; and
etching, using the fourth mask layer, the portion of the substrate outside the first trench to the desired depth to expand a portion of the first trench to form the first groove.

* * * * *

UNITED STATES PATENT AND TRADEMARK OFFICE
CERTIFICATE OF CORRECTION

PATENT NO. : 12,074,126 B2
APPLICATION NO. : 17/725413
DATED : August 27, 2024
INVENTOR(S) : Liang Wang and Qian Xu It is certified that error appears in the above-identified patent and that said Letters Patent is hereby corrected as shown below:

In the Claims

In Claim 7, Column 17, Line 18, "where do is a minimum width of the second groove, h is the" should read -- where d0 is a minimum width of the second groove, h is the --.

Signed and Sealed this
Fifth Day of November, 2024

Katherine Kelly Vidal
*Director of the United States Patent and Trademark Office*